United States Patent [19]
Marion et al.

[11] Patent Number: 6,166,368
[45] Date of Patent: Dec. 26, 2000

[54] PHOTODETECTION DEVICE, PROCESS FOR THE PRODUCTION OF THIS DEVICE AND APPLICATION TO MULTISPECTRAL DETECTION

[75] Inventors: François Marion, St Egreve; Patrick Agnese, Voreppe, both of France

[73] Assignee: Commissariat a l'Energie Atomique, Paris, France

[21] Appl. No.: 09/189,845

[22] Filed: Nov. 12, 1998

[30] Foreign Application Priority Data

Dec. 1, 1997 [FR] France .................................. 97 15082

[51] Int. Cl.[7] .................................................. H01L 31/00
[52] U.S. Cl. .................................... 250/214 LA; 136/249; 136/256; 438/71
[58] Field of Search ........................... 250/214 LA, 338.1, 250/338, 4; 136/249, 256, 258, 259; 438/62, 71, 72, 74; 257/53

[56] References Cited

U.S. PATENT DOCUMENTS

| | | | |
|---|---|---|---|
| 4,442,310 | 4/1984 | Carlson et al. | 136/256 |
| 5,250,120 | 10/1993 | Takada et al. | 136/256 |
| 5,569,332 | 10/1996 | Glatfelter et al. | 136/249 |

*Primary Examiner*—Que T. Le
*Assistant Examiner*—Thanh X. Luu
*Attorney, Agent, or Firm*—Oblon, Spivak, McClelland, Maier & Neustadt, P.C.

[57] ABSTRACT

A photodetection device including at least one element incorporating a radiation absorption layer and an unabsorbed radiation reflection layer. The absorbing layer creates a first phase shift of the reflected radiation compared with the incident radiation. According to the invention, between the absorbing layer and the reflecting layer a layer is provided creating a second phase shift, which compensates the first phase shift for obtaining a substantially flat spectral response of the device.

24 Claims, 6 Drawing Sheets

PHOTODETECTION DEVICE, PROCESS FOR THE PRODUCTION OF THIS DEVICE AND APPLICATION TO MULTISPECTRAL DETECTION

DESCRIPTION

1. Technical Field

The present invention relates to a photodetection device and more particularly to multispectral detection. The invention also relates to a process for the production of the photodetection device.

The invention makes it possible to produce both a detector by photo-conduction and a photovoltaic detector.

2. Prior Art

Photoconduction and photovoltaic detection methods can lead to the formation of thin, semiconductor layers permitting the absorption of photons and the generation of electron-hole pairs by interband transition (intrinsic transition) or intraband transition (extrinsic transition).

In the case of a thin layer or film, the incident radiation is absorbed over a limited thickness.

Figure 1:
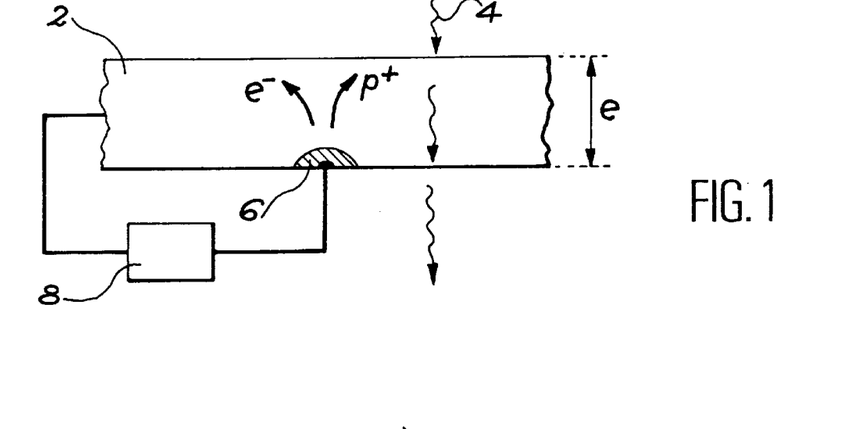
FIG. 1 Diagrammatically a known photodetector without a reflecting layer and which has already been described.

An example of a photovoltaic detector is diagrammatically shown in cross-section in FIG. 1. This detector comprises a thin semiconductor layer 2, whose thickness is designated e and which receives the incident radiation 4 which it wants to detect. In addition, a PN junction is created in the layer 2. To this end, the layer 2 is e.g. of type P and in said layer is formed a type N zone 6.

When the incident radiation 4 is absorbed by the layer 2, which constitutes a detecting or active layer, electron-hole pairs e⁻-p⁻ are created in said layer 2 and the resulting charges are collected in the space charge area of the PN junction.

FIG. 1 shows a device 8 for detecting the thus produced electric current. This device 8 connects the type P zone to the type N zone of the detector.

For noise limitation or ease of production reasons, it may be necessary to reduce to the maximum the thickness e of the detecting layer 2.

However, in order to recover a maximum of incident photons, it is then necessary to provide on said thin layer 2, on the side of the N doped zone, a reflecting layer for reflecting the radiation 10 not absorbed by the layer 2.

Figure 2:
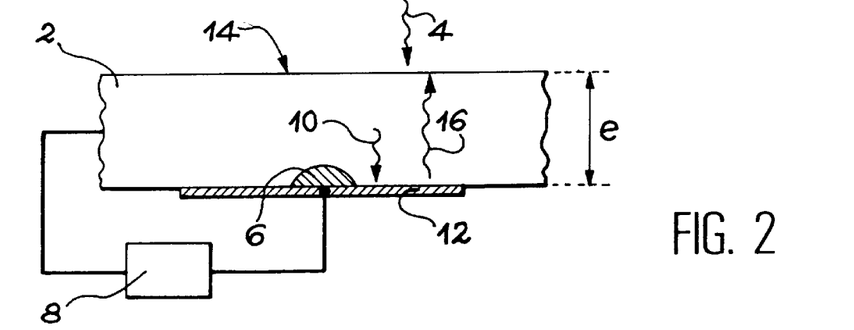
FIG. 2 Diagrammatically a known photodetector with reflecting layer and which has already been described.

This leads to a detector of the type diagrammatically shown in cross-section in FIG. 2.

FIG. 2 shows the reflecting layer 12 formed on the face of the layer 2 on the side where the type N zone 6 is located.

Thus, when the photons have traversed the thin layer 2 without being absorbed by the latter are reflected towards the entry face 14 thereof (face by which the incident radiation 4 enters) by the layer 12, which thus reinjects them into the layer 2.

The quantum efficiency of the detector of FIG. 2 (which is the number of carriers produced divided by the number of incident photons) consequently exceeds that of the detector of FIG. 1.

If there is an adequate reduction of the thickness e of layer 2, there may even be unabsorbed photons which reach the entrance face 14 of the detector of FIG. 2.

If part of the photons is not absorbed in the path of length $2e$, there is a standard interference phenomenon at the entrance face 14, between the entering radiation 4 and the exiting radiation 16.

In view of the fact that the aim is to obtain a maximum light absorption by layer 2, the procedure is such that there is a minimum reflection at the entrance face 14. There is then a wavelength $\lambda\min$ such that:

$$2n.e=(2k+1)\lambda\min/2.$$

In said equation, n represents the refractive index of layer 2 and k is a relative integer. A radiation of wavelength $\lambda\min$ thus creates a minimum reflection in the entrance face 14 of the detector of FIG. 2.

As soon as the wavelength of the incident radiation moves away from said wavelength $\lambda\min$, the reflection increases on the entrance face 14 of the detector. For certain wavelengths $\lambda\max$, there can even be a reflection maximum instead of a minimum in said entrance face.

Such a reflection maximum is obtained when the following equation is proved:

$$2n.e=k.\lambda\max.$$

Figure 3:
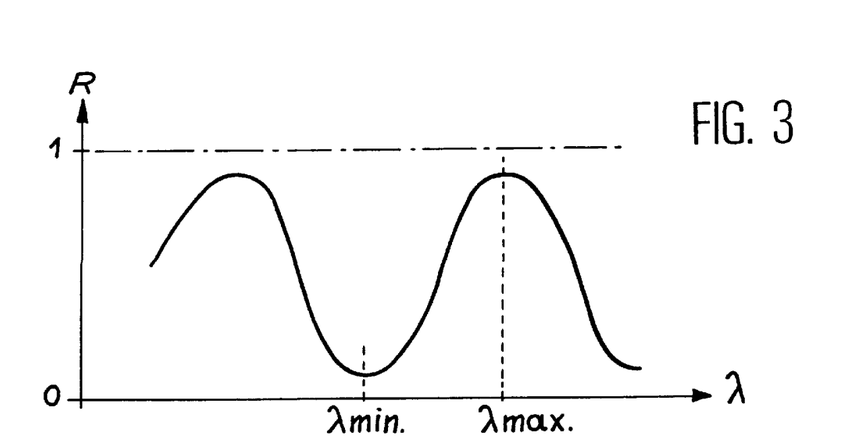
FIG. 3 The reflection spectrum of an absorbing thin layer of the type comprising the detector of FIG. 2 and on whose entrance face occur interferences and which has already been described.

FIG. 3 shows the variations of the intensity ratio R of the optically reflected radiation to the intensity of the incident radiation as a function of the wavelength $\lambda$.

FIG. 3 illustrates the possibility of obtaining for the wavelength $\lambda\min$, a minimum reflected radiation at the entrance face 14 and for another wavelength $\lambda\max$, a maximum of reflected radiation at said entrance face.

Figure 4:
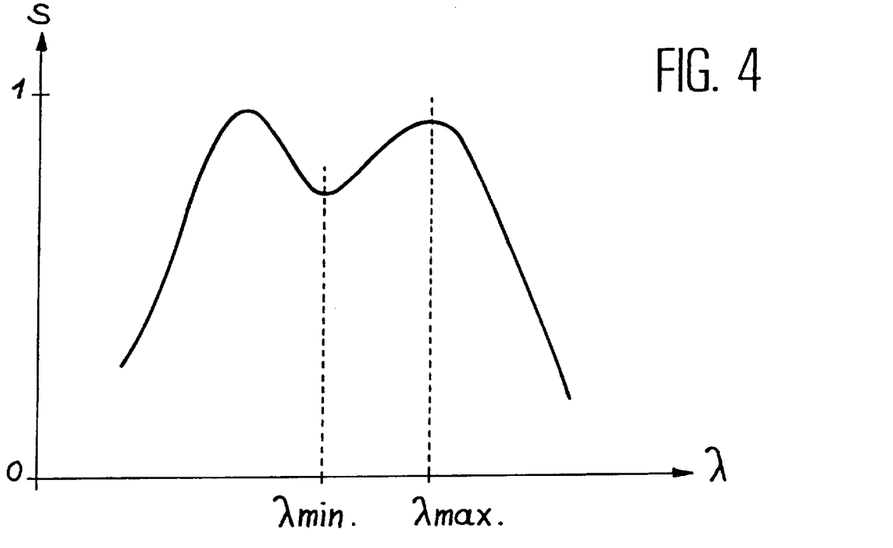
FIG. 4 The standardized spectral response of a detector according to FIG. 2 and which has already been described.

The spectral response of a detector of the type shown in FIG. 2 can then be in the form shown in FIG. 4. FIG. 4 shows the variations of the standardized spectral response S of the detector as a function of the wavelength $\lambda$. This spectral response S is the product of the "optical" absorption by the "electrical" response of the detector.

One of the problems caused by a detector of the type shown in FIG. 2 is that, in certain cases, the thickness e of the layer 2 may not be perfectly controlled and consequently several detectors having different thicknesses e (everything else being otherwise equal) have different wavelengths $\lambda\min$ and $\lambda\max$.

Figure 5:
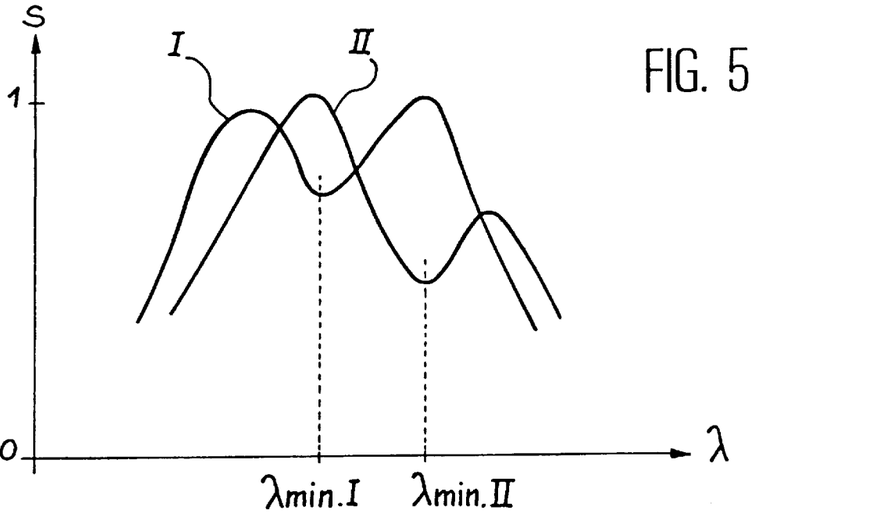
FIG. 5 The respective spectral responses of two photodetectors not having the same active layer thickness and which have already been described.

This is diagrammatically illustrated in FIG. 5, where it is possible to see the standardized spectral response S as a function of the wave-length $\lambda$ for a first detector (curve I) and for a second detector (curve II), whose absorbing layers do not have the same thickness.

It is e.g. possible to see in FIG. 5 that the wavelength $\lambda\min$I corresponding to a reflection minimum in the entrance face of the first detector differs from the wavelength $\lambda\min$II corresponding to a reflection minimum in the entrance face of the second detector.

This problem can be significant in the case of array detectors, i.e. detectors juxtaposed on the same absorbing layer and forming an array thereon.

In this case, there are detectors or detection pixels not having the same spectral response as their neighbours if the thickness e of the absorbing layer is not constant over the complete array.

DESCRIPTION OF THE INVENTION

The object of the invention is to obviate the aforementioned disadvantages.

The invention therefore relates to a photodetection device incorporating at least one photodetection element, which comprises:

an absorbing layer able to absorb part of an incident radiation, falling on a first face of said absorbing layer and a reflecting layer positioned facing a second face of said absorbing layer and able to reflect part of said radiation not absorbed by the absorbing layer, said absorbing layer creating a first phase shift of the thus reflected radiation compared with the incident radiation, said device being characterized in that it also comprises a phase shift layer between the reflecting layer and at least part of the absorbing layer and able to create a second phase shift of the radiation reflected by the reflecting layer compared with the incident radiation, the thickness of the phase shift layer being chosen in such a way that the first and second phase shifts compensate one another in order to obtain a substantially flat spectral response on the part of the device in a given wavelength range.

Preferably, the refractive index of the material forming the phase shift layer is close to the refractive index of the material forming the absorbing layer.

According to a preferred embodiment of the device according to the invention, the absorbing layer and the phase shift layer are made from the same material.

According to a first special embodiment, the second phase shift is discreet and the phase shift layer covers half the second face of the absorbing layer.

In this case, the phase shift layer can cover a peripheral part of the second face of the absorbing layer, the thus covered part having the same area as the uncovered part of said second face.

According to a second special embodiment, the second phase shift is continuous and gradual from one side to the other of the second face of the absorbing layer.

The device according to the invention can have several such photodetection elements organized in array form.

A device according to the invention can comprise several of these photodetection elements alternating with other photodetection elements, each incorporating only said absorbing layer and said reflecting layer, so as to form a multispectral detector.

It is also possible to obtain a multispectral detector by providing several such photodetection elements forming a plurality of photodetection element groups, the thickness of the phase shift layer being the same for all the elements of the same group, but differing between individual groups, so as to form a multispectral detector.

The invention also relates to a process for the production of the photodetection device according to the invention, said process being characterized in that firstly the absorbing layer is formed and then, for each photodetection element, the phase shift layer and then the reflecting layer.

According to a first embodiment of the process according to the invention, a phase shift layer is formed on the absorbing layer and then etched for each photodetection element.

According to a second embodiment of the process, the phase shift layer is formed by etching the absorbing layer.

BRIEF DESCRIPTION OF THE DRAWINGS

The invention is described in greater detail hereinafter relative to non-limitative embodiments and with reference to the attached drawings, wherein show.

DETAILED DESCRIPTION OF EMBODIMENTS

Figure 6:
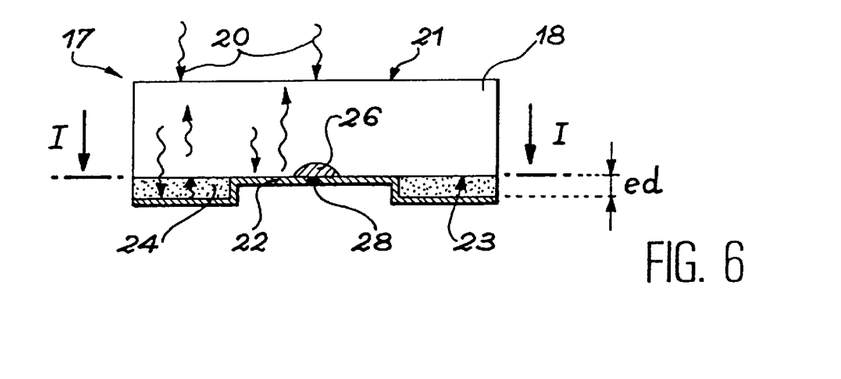
FIG. 6 A diagrammatic cross-sectional view of an embodiment of the device according to the invention.

FIG. 6 is a diagrammatic cross-sectional view of a device according to the invention.

In the embodiment shown, it is a photovoltaic device incorporating one or more photodetection elements such as element 17 and which incorporates:

a thin absorbing layer 18 made from a semiconductor material, e.g. of the P type, which is able to absorb part of a radiation 20 falling on a first or front face 21 of said layer 18 and a reflecting layer 22 positioned facing a second or rear face 23 of the layer 18 and able to reflect part of said radiation not absorbed by the layer 18.

According to the invention, the photodetection element 17 also comprises another layer 24 known as the phase shift layer, whose thickness is designated ed and whose refractive index is designated nd. Said layer 24 is placed between the layers 18 and 22 and, in the embodiment shown, said layer 24 only covers half the second face 23 of layer 18.

Figure 7:
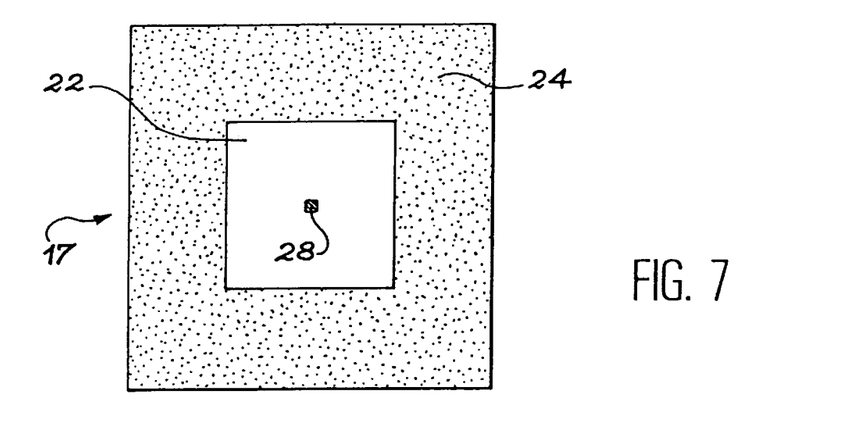
FIG. 7 Section I—I of FIG. 6.

FIG. 7 is section I—I of FIG. 6, i.e. a sectional view of the latter, whose sectional plane contains the interface of layers 18 and 24.

It can be seen that the layer 24 covers a peripheral portion of the second face 23 of absorbing layer 18. The thus covered portion has the same area as the uncovered portion of said second face.

FIG. 6 also shows the type N zone 26 of the photovoltaic detector on the side of the face 23 of layer 18 and an electrical contact 28 permitting the connection of said zone 26 to an external device during the use of element 17.

In general terms, the thickness ed of layer 24 is dependent on the detection type and the considered wavelength range. In the considered embodiment, it is pointed out that it is a photovoltaic detection.

More specifically, the thickness of layer 24 is chosen in such a way that the optical path covered by the radiation between the moment where it penetrates the layer 24 and the moment when it leaves the latter, following reflection by layer 22, proves the following equation:

$$2nd.ed = (2k+1)\lambda c/2$$

in which k is a relative integer and $\lambda c$ represents the center of the spectral range considered (centre of the wavelength range). It is e.g. possible to choose k=0, the layer 24 then constituting a type of "quarter wave" layer.

Preferably, said layer 24 is made from a material with a refractive index close to that of the material forming layer 18. It is possible to use the same material for layers 18 and 24. The aim is obviously to minimize reflections at the interface between layers 18 and 24.

Figure 8:
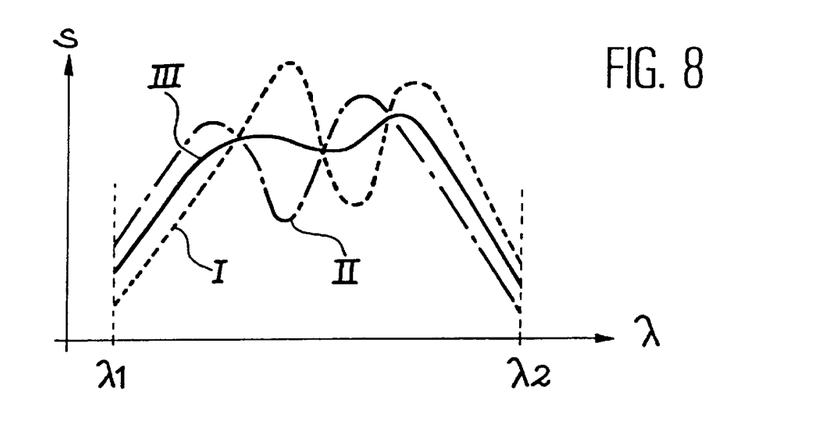
FIG. 8 The spectral response of the device of FIGS. 6 and 7.

FIG. 8 shows variations of the standardized spectral response S as a function of the wavelength $\lambda$ for a device of the type shown in FIGS. 6 and 7.

The spectral range considered is defined by two wavelengths $\lambda 1$ and $\lambda 2$. In the space segment not having the phase shift layer 24, the spectral response corresponds to curve I. In the space segment having the layer 24, the spectral response corresponds to curve II.

It can be seen that in said second space segment, the electromagnetic return wave is phase shifted by $\lambda c/2$ compared with that of curve I. Consequently the minima of curve II are located at the maxima of curve I.

The overall response of the photodetection element or pixel 17 corresponds to the sum of the photons absorbed in the space segment not having the layer 24 and the photons absorbed in the space segment having the layer 24. This overall or total response is represented by the sum of the spectral responses corresponding to both segments. The variations of said sum as a function of the wavelength are represented by curve III, which represents the mean of curves I and II.

It can be seen that the resultant spectral response of photodetection element 1 is substantially flat in the considered spectral range ($\lambda 1$, $\lambda 2$).

Thus the output signal of said photodetection element 17 is proportional to the number of carriers produced in said element and therefore to the sum of the carriers produced in the phase shift layer-free segment and the carriers produced in the phase shift layer-equipped segment.

No matter what the thickness e of the absorbing layer 18, the resultant spectral response is the sum of two complimentary spectral responses, one having maxima in the wavelengths corresponding to the minima of the other and vice versa.

The result is a substantially flat spectral response in a possibly wide wavelength range. In practice, this response is independent of the thickness of the absorbing layer 18.

In order to accurately determine the thickness of the layer 18 and that of the layer 24 and the materials to be used for said layers, as well as the planeity of the spectral response in the considered range, it is appropriate to carry out a profound simulation of the device taking account of the variability of the absorption coefficient of the material constituting the absorbing layer in the considered spectral range. Such a simulation will be considered hereinafter.

Figure 9:
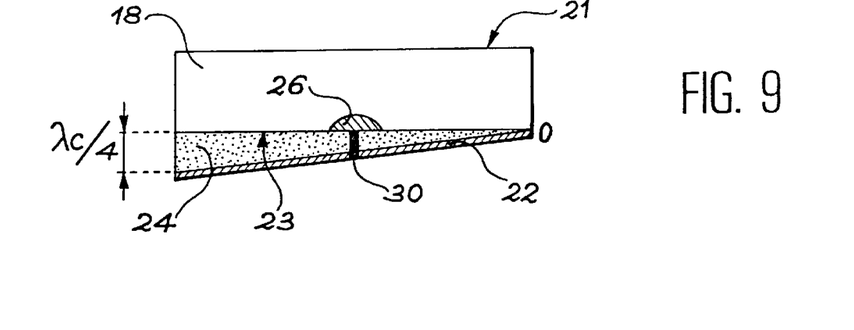
FIG. 9 A diagrammatic cross-sectional view of another embodiment of the device according to the invention.

FIG. 9 is a diagrammatic cross-sectional view of another embodiment of the device according to the invention. FIG. 9 shows a detection element differing from that of FIG. 7 through the structure of the phase shift layer 24.

In the case of FIG. 7, the phase shift supplied by the layer 24 is discreet, said layer 24 having a constant thickness, but only covering part of the rear face 23 of layer 18. However, in the case of FIG. 9, the phase shift supplied by the layer 24 is gradual.

Said layer 24 covers the entire rear face 23 of layer 18, but the thickness of said layer 24 increases in linear manner from one end of the face 23 of layer 18 to the other end of said face 23.

More specifically, the product of said thickness by the refractive index nd of the material constituting said phase shift layer 24 varies in linear manner from 0 at one end of the layer 24 to the value $\lambda c/4$ at the other end of said layer 24.

The embodiment of FIG. 9 can permit a better damping of peaks of the spectral response than in the case of FIG. 7.

In the case of FIG. 9, it is appropriate to form through the layers 24 and 22 an electrically conductive zone 30, which is in contact with the type N zone in order to permit the connection thereof to an external device during the use of the element of FIG. 9.

The advantages of the present invention are indicated hereinafter. The invention makes it possible to obtain a photodetection device, whose spectral response is substantially flat. Moreover, said spectral response is the same for all the photodetection elements, no matter what the thickness of the absorbing layer used for the detection.

The invention permits an easy definition of the cutoff wavelength of the device. This cutoff wavelength is often defined as the wavelength corresponding to a signal, whose amplitude is equal to half the amplitude of the response peak.

For a conventional photodetection device, the amplitude of said response peak is very variable, because it is the result of the product of the optical response by the electrical response of the photodetection device.

Thus, the cutoff wavelength is highly dependent on the thickness of the material constituting the absorbing layer.

Figure 10:
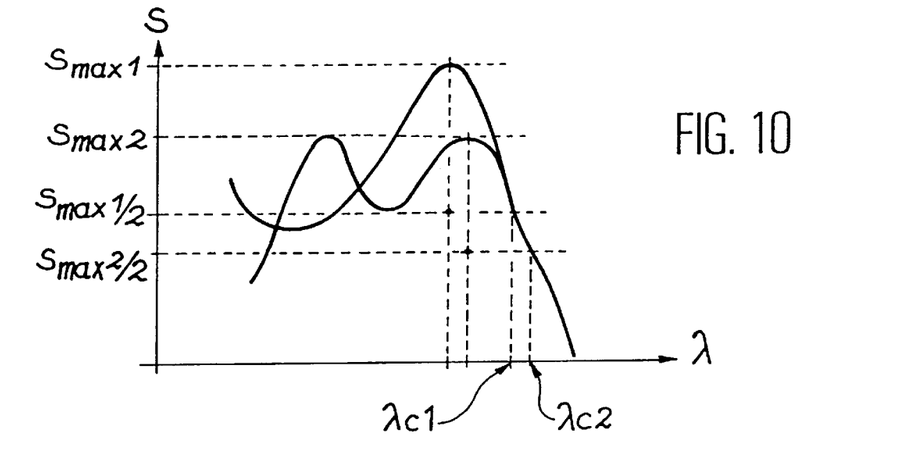
FIG. 10 The respective spectral responses of two photodetectors not having the same absorbing layer thickness or the same cutoff wavelength.

The problem of said cutoff wavelength variation is diagrammatically illustrated in FIG. 10, which shows the variations of the standardized spectral response S as a function of the wavelength $\lambda$ correction by a phase shift layer.

Consideration is given to an absorbing material thickness e1 and the height of the corresponding peak is designated Smax1. Consideration is also given to a thickness e2 of said material and the height of the peak corresponding to said thickness 32 is designated Smax2.

FIG. 10 also shows the cutoff wavelengths $\lambda c1$ and $\lambda c2$ respectively corresponding to the thicknesses e1 and e2.

Figure 11:
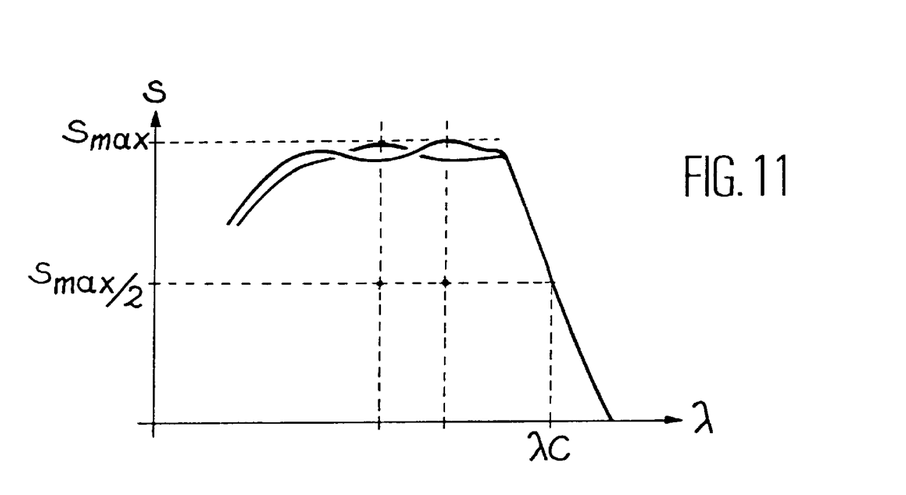
FIG. 11 The respective spectral responses of said two photodetectors equipped with phase shift layers according to the invention.

FIG. 11 shows the variations of the standardized spectral response S as a function of the wavelength $\lambda$ in the case where use is made of a phase shift layer over half the surface of the photodetection element, as shown in FIGS. 6 and 7.

In FIG. 11, it is possible to see that the amplitudes Smax1 and Smax2 are equal to the same value Smax and the cutoff wavelengths $\lambda c1$ and $\lambda c2$ are equal to the same value $\lambda c$.

Figure 12:
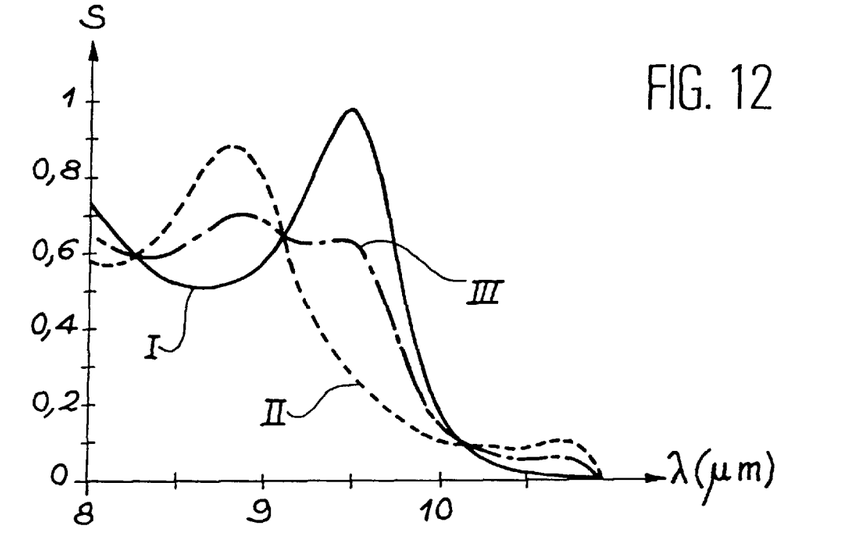
FIG. 12 The spectral response obtained by the simulation of a detector according to the invention.

A real simulation example is diagrammatically illustrated in FIG. 12, which shows the variations of the standardized spectral response S as a function of the wavelength $\lambda$ in micrometres.

Curve I in FIG. 12 represents the spectral response of a photodetection element, whereof the absorbing layer has a thickness 6 $\mu$m and which is not provided with a phase shift layer.

Curve II represents the spectral response of the same photodetection element, but which is also provided with a phase shift layer of thickness 1 $\mu$m and located between the absorbing layer and the reflecting layer of said photodetection element.

Curve III represents the spectral response of the same photodetection element, but incorporating said 1 $\mu$m thick phase shift layer over half its surface (in order to form a device like that of FIGS. 6 and 7).

FIGS. 13A to 13D diagrammatically illustrate different stages of a process for the production of a photodetection device according to the invention.

Said device comprises a plurality of photodetection elements or pixels and it is possible to see three adjacent pixels 32, 34 and 36. The structure of said device can be of the array type.

The process illustrated in FIGS. 13A to 13D results from a modification of the conventional process making it possible to obtain a photodetection device provided with a reflecting layer, but not a phase shift layer.

Figures 13A, 13B:
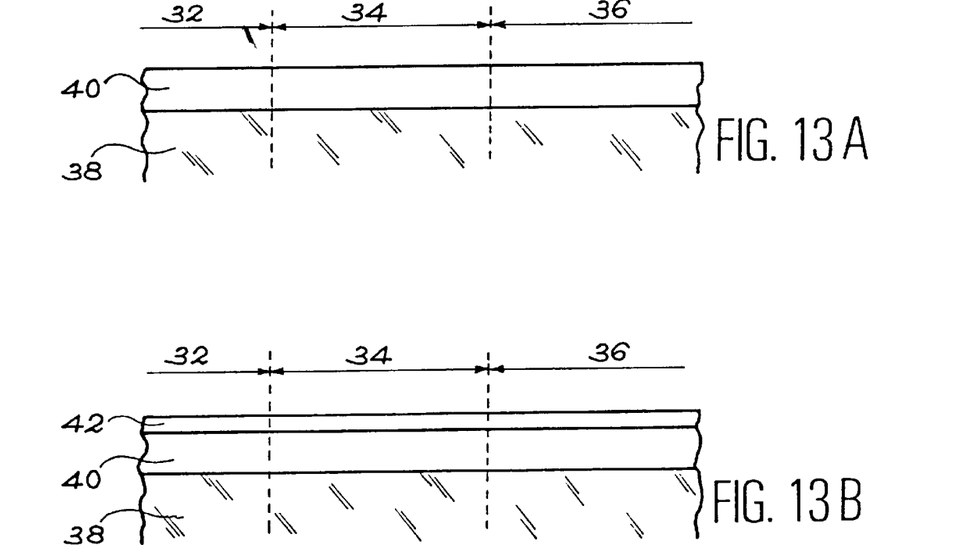
FIGS. 13A Diagrammatically stages of a process according to the to 13D invention.

Thus, formation takes place on a substrate 38 transparent in the considered wavelength range, of an absorbing layer or a detecting layer 40 (FIG. 13A). The radiation which it is wished to detect in the wavelength range reaches the layer 40 through substrate 38.

Then (FIG. 13B), formation takes place over the entire surface of said layer 40 of a phase shift layer 42, which can be of the same material as layer 40.

Figure 13C:
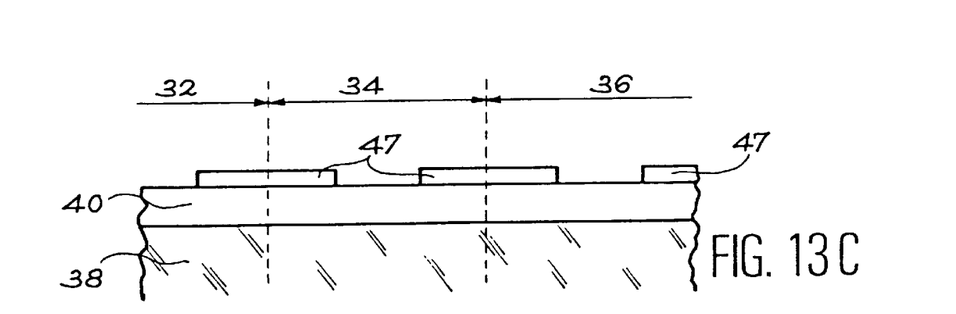
Figure 13D:
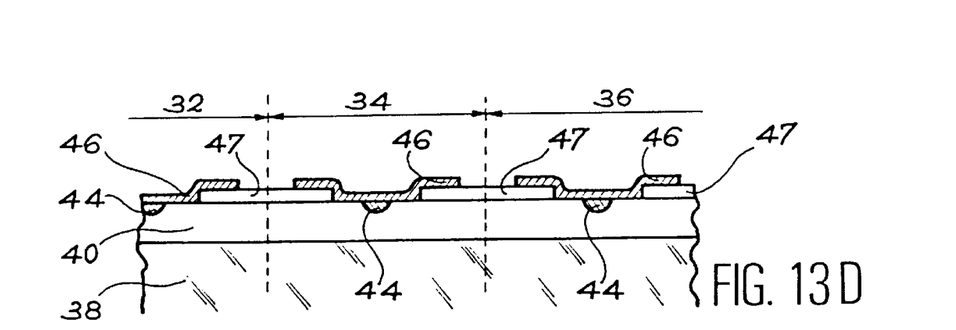

The thickness ed of said layer 42 is such that the product of ed by the refractive index of the material constituting said layer 42 is equal to quarter the central wavelength of the considered wavelength range. This phase shift layer is then etched over half the surface of each pixel during a photolithography stage (FIG. 13C).

The conventional process for the production of the photodetection device is then continued. Formation in particular takes place (FIG. 13D) of a type N zone in each pixel (assuming that layer 40 is of type P), followed by the formation of a reflecting layer 46 on zones 47 of the phase shift layer obtained by etching and on the exposed face of the absorbing layer, followed by the removal of portions of said reflecting layer 46 in order to separate the pixels from one another.

According to a not shown embodiment, at the start of production, the absorbing layer is etched over half the surface of each pixel and over a depth such that the product of said thickness by the refractive index of the material constituting said layer is equal to quarter the central wavelength of the considered spectral range.

The application of the present invention to thin layer photodetectors makes it possible to obtain array detectors, whose performance characteristics are improved compared with conventional array detectors (without phase shift layer).

Figure 14:
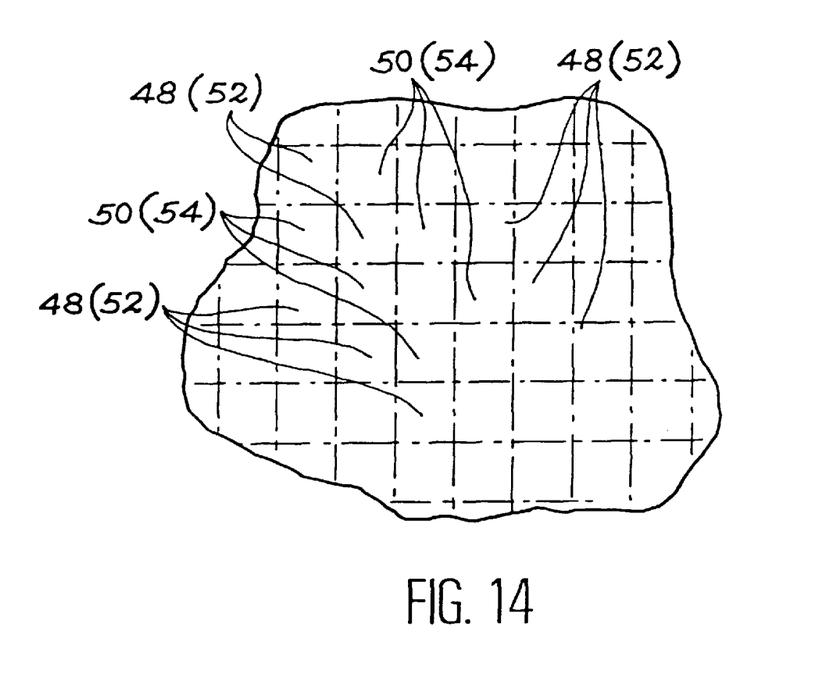
FIG. 14 Diagrammatically multispectral detectors according to the invention.

The present invention also makes it possible to obtain a multispectral detector, whose structure is of the array type and which comprises, as shown in the plan view of FIG. 14, photodetection elements 48 having no phase shift layer and alternating with other photodetection elements 50 which, according to the invention, incorporate a phase shift layer.

The extraction of electric signals from the photodetection elements 48 and 50 makes it possible to carry out a multispectral detection (detection of two wavelengths in the case of FIG. 14). Thus, the two categories of photodetection elements have maxima at two different wavelengths and permit a detection in different wavelength ranges.

Another multispectral detector according to the invention also has an array structure and comprises a group of photodetection elements 52 according to the invention and another group of photodetection elements according to the invention, which alternate with the elements 52, as is also visible in FIG. 14. The elements 52 are identical. The elements 54 are also identical, but the thickness of the phase shift layer of said elements 54 differs from the thickness of the phase shift layer of elements 52.

These layers of different thicknesses create multiple absorption peaks at wavelengths which can be controlled. However, it should be noted that in this case the thickness of the absorbing layer must be perfectly controlled.

Use is e.g. made of the molecular beam epitaxy method for forming said absorbing layer.

It is also possible to envisage a tricolour detection (detection of three wavelengths instead of two in the case of FIG. 14, which requires three groups of photodetection elements corresponding to three different thicknesses for the phase shift layer).

In the embodiments considered hereinbefore, a description has been given of photovoltaic detection devices according to the invention using semiconductor absorbing layers. However, according to the invention, it is also possible to implement photodetection devices by photoconduction using photoconductive absorbing layers.

The essential feature of the present invention is the use of the phase shift layer, which can be formed both on an absorbing layer of a photovoltaic device and on an absorbing layer of a photoconduction-based detection device.

It is pointed out that for forming a device according to the invention of the type of FIG. 9, it is merely necessary to replace the stage diagrammatically illustrated in FIG. 13C by a stage in which etching takes place of the phase shift layer 42, in order to give it, in each pixel, the form shown in FIG. 9.

What is claimed is:

1. A photodetection device having at least one photodetection element, comprising:
    an absorbing layer configured to absorb part of an incident radiation incident on a first face of said absorbing layer;
    a reflecting layer positioned facing a second face of said absorbing layer and configured to reflect a part of said incident radiation not absorbed by the absorbing layer;
    a phase shift layer disposed between the reflecting layer and at least a part of the absorbing layer,
    wherein a thickness of the phase shift layer is selected so that a first phase shift with respect to the incident radiation and radiation reflected by the reflecting layer on parts of the absorbing layer not having the phase shift layer, and a second phase shift with respect to the incident radiation and radiation reflected by the reflecting layer on parts of the absorbing layer having the phase shift layer compensate one another to obtain a substantially flat spectral response from a given wavelength range.

2. The device according to claim 1, wherein the phase shift layer includes a material having a refractive index close to a refractive index of a material forming the absorbing layer.

3. The device according to claim 2, wherein the absorbing layer and phase shift layer comprise a same material.

4. The device according to claim 1, wherein the second phase shift is discrete and the phase shift layer covers half of the second face of the absorbing layer.

5. The device according to claim 4, wherein the phase shift layer covers a peripheral portion of the second face of the absorbing layer, said covered portion having a same area as an uncovered portion of said second face.

6. The device according to claim 1, wherein the at least one photodetection element includes a plurality of photodetection elements organized in an array form.

7. The device according to claim 1, wherein the at least one photodetection element includes a plurality of photodetection elements alternating with other photodetection elements, each of said other photodetection elements incorporating solely said absorbing layer and said reflecting layer, so as to form a multispectral detector.

8. The device according to claim 1, wherein the at least one photodetection element includes a plurality of groups of photodetection elements,
    wherein the thickness of the phase shift layer is the same for all elements of a same group, but different between individual groups, so as to form a multispectral detector.

9. A photodetection device having at least one photodetection element, comprising:

an absorbing layer configured to absorb part of an incident radiation incident on a first face of said absorbing layer;

a reflecting layer positioned facing a second face of said absorbing layer and configured to reflect a part of said incident radiation not absorbed by the absorbing layer;

a phase shift layer disposed between the reflecting layer and at least a part of the absorbing layer, wherein a thickness of the phase shift layer increases in a linear manner from one end of the second face of the absorbing layer to an opposite end.

10. The device according to claim 9, wherein the phase shift layer includes a material having a refractive index close to a refractive index of a material forming the absorbing layer.

11. The device according to claim 9, wherein the absorbing layer and phase shift layer comprise a same material.

12. The device according to claim 9, wherein the at least one photodetection element includes a plurality of photodetection elements organized in an array form.

13. The device according to claim 9, wherein the at least one photodetection element includes a plurality of photodetection elements alternating with other photodetection elements, each of said other photodetection elements incorporating solely said absorbing layer and said reflecting layer, so as to form a multispectral detector.

14. A method of producing a photodetection device having at least one photodetection element, comprising the steps of:

forming an absorbing layer for absorbing part of an incident radiation incident on a first face of said absorbing layer;

forming a phase shift layer on at least a part of a second face of the absorbing layer;

forming a reflecting layer on the second face of the absorbing layer and the phase shift layer formed on at least part of the second face of the absorbing layer for reflecting a part of the incident radiation not absorbed by the absorbing layer; and selecting a thickness of the phase shift layer so that a first phase shift with respect to the incident radiation and radiation reflected by the reflecting layer on parts of the absorbing layer not having the phase shift layer and a second phase shift with respect to the incident radiation and radiation reflected by the reflecting layer on parts of the absorbing layer having the phase shift layer compensate one another to obtain a substantially flat spectral response from a given wavelength range.

15. The method according to claim 14, further comprising the step of:

etching the phase shift layer formed on the absorbing layer for each of the at least one photodetection elements.

16. The method according to claim 14, wherein the step of forming the phase shift layer comprises etching the absorbing layer.

17. The method according to claim 14, wherein the phase shift layer includes a material having a refractive index close to a refractive index of a material forming the absorbing layer.

18. The method according to claim 14, wherein the absorbing layer and phase shift layer comprise a same material.

19. The method according to claim 14, wherein the step of forming phase shift layer covers half of the second face of the absorbing layer, said second phase shift being discrete.

20. The method according to claim 19, wherein the step of forming the phase shift layer covers a peripheral portion of the second face of the absorbing layer, said covered portion having a same area as an uncovered portion of said second face.

21. The method according to claim 14, wherein the at least one photodetection element includes a plurality of photodetection elements organized in an array form.

22. The method according to claim 14, wherein the at least one photodetection element includes a plurality of photodetection elements alternating with other photodetection elements, each of said other photodetection elements incorporating solely said absorbing layer and said reflecting layer, so as to form a multispectral detector.

23. The method according to claim 14, wherein the at least one photodetection element includes a plurality of photodetection elements, and wherein the thickness of the phase shift layer is the same for all elements of a same group, but different between individual groups to form a multispectral detector.

24. A method of producing a photodetection device having at least one photodetection element, comprising the steps of:

forming an absorbing layer for absorbing part of an incident radiation incident on a first face of said absorbing layer;

forming a phase shift layer on at least a part of a second face of the absorbing layer;

forming a reflecting layer on the second face of the absorbing layer and the phase shift layer formed on at least part of the second face of the absorbing layer for reflecting a part of the incident radiation not absorbed by the absorbing layer; and selecting a thickness of the phase shift layer to increase in a linear manner from one end of the second face of the absorbing layer to the other end.

* * * * *